(12) United States Patent
Sufrin-Disler et al.

(10) Patent No.: US 9,007,066 B2
(45) Date of Patent: Apr. 14, 2015

(54) MEASURING ISOLATED HIGH VOLTAGE AND DETECTING ISOLATION BREAKDOWN WITH MEASURES FOR SELF-DETECTION OF CIRCUIT FAULTS

(75) Inventors: Daniel A. Sufrin-Disler, Duarte, CA (US); Peter Fredrick Nortman, Monrovia, CA (US); Phillip John Weicker, Pasadena, CA (US); William G. Norris, New York, NY (US); Anthony M. Sansone, Burbank, CA (US)

(73) Assignee: Coda Energy Holdings LLC, Los Angeles, CA (US)

( * ) Notice: Subject to any disclaimer, the term of this patent is extended or adjusted under 35 U.S.C. 154(b) by 637 days.

(21) Appl. No.: 13/312,064

(22) Filed: Dec. 6, 2011

(65) Prior Publication Data

US 2012/0139549 A1      Jun. 7, 2012

Related U.S. Application Data

(60) Provisional application No. 61/420,261, filed on Dec. 6, 2010, provisional application No. 61/420,259, filed on Dec. 6, 2010, provisional application No. 61/420,264, filed on Dec. 6, 2010.

(51) Int. Cl.
*G01N 27/416* (2006.01)
*H02J 7/00* (2006.01)
*H02J 9/00* (2006.01)

(52) U.S. Cl.
CPC ............ *H02J 7/0016* (2013.01); *Y02T 10/7055* (2013.01); *H02J 7/0075* (2013.01); *H02J 9/002* (2013.01)

(58) Field of Classification Search
CPC ..... H02J 7/0014; H02J 7/0016; H02J 7/0029; H02J 7/007; H02J 7/0075; G01N 27/416; G01N 27/4166; G01N 7/419

USPC ........... 324/426, 427, 433; 320/107, 116, 132
See application file for complete search history.

(56) References Cited

U.S. PATENT DOCUMENTS 5,608,306 A   3/1997   Rybeck et al.
5,818,201 A   10/1998  Stockstad et al.
(Continued)

FOREIGN PATENT DOCUMENTS

CN   1379301 A   11/2002
CN   1473371 A   2/2004
(Continued)

OTHER PUBLICATIONS

International Search Report and Written Opinion for International Application No. PCT/US2011/063523 dated Jul. 31, 2012.
(Continued)

*Primary Examiner* — Edward Tso
(74) *Attorney, Agent, or Firm* — Wolf, Greenfield & Sacks, P.C.

(57) ABSTRACT

A system for making high voltage measurements to measure a voltage of a battery pack and detect of an isolation fault. The system includes a first resistive divider comprising at least a first resistive element and a second resistive element. The system also includes a second resistive divider comprising the second resistive element and a third resistive element. The system also includes a plurality of switches comprising a first switch and a second switch coupled between the second resistive element and the battery pack. The system further includes a controller configured to control the plurality of switches to operate in first mode to measure the voltage of the battery pack based on a voltage produced by the first resistive divider, and to control the plurality of switches to operate in at least a second mode to detect an isolation fault based on a voltage produced by the second resistive divider.

30 Claims, 12 Drawing Sheets

(56) References Cited

U.S. PATENT DOCUMENTS

| | | | |
|---|---|---|---|
| 6,043,628 A | 3/2000 | Perelle et al. | |
| 7,560,900 B2 | 7/2009 | Cherng et al. | |
| 2003/0155928 A1* | 8/2003 | Roden et al. | 324/509 |
| 2005/0231217 A1* | 10/2005 | Carruthers | 324/691 |
| 2007/0296376 A1 | 12/2007 | Marquet et al. | |
| 2008/0164882 A1* | 7/2008 | Jaeger et al. | 324/434 |
| 2011/0049977 A1* | 3/2011 | Onnerud et al. | 307/9.1 |
| 2013/0119935 A1 | 5/2013 | Sufrin-Disler et al. | |

FOREIGN PATENT DOCUMENTS

| | | |
|---|---|---|
| CN | 101281216 A | 10/2008 |
| CN | 101470172 A | 7/2009 |
| CN | 101545955 A | 9/2009 |
| CN | 101762789 | 6/2010 |
| JP | 2000348780 A | 12/2000 |
| JP | 2010183831 A | 8/2010 |
| WO | 9206525 A2 | 4/1992 |

OTHER PUBLICATIONS

International Search Report and Written Opinion for International Application No. PCT/US2011/063507 dated Jul. 11, 2012.
International Search Report and Written Opinion for International Application No. PCT/US2011/063487 dated May 11, 2012.
Office Action for Chinese Application No. CN201180004281.2 dated Jan. 20, 2014.
Kliger et al., "iCoupler® Isolation in CAN Bus Applications" *Analog Devices AN-770 Application Note, Rev.0*, pp. 1-7.
"Triple-Channel Digital Isolators ADuM1300/ADuM1301" *Analog Devices Rev. H*, pp. 1-28.
"Multicell Battery Stack Monitor" *Linear Technology LTC6802-1*, pp. 1-38.

\* cited by examiner

MEASURING ISOLATED HIGH VOLTAGE AND DETECTING ISOLATION BREAKDOWN WITH MEASURES FOR SELF-DETECTION OF CIRCUIT FAULTS

RELATED APPLICATIONS

This application claims the benefit under 35 U.S.C. 119(e) of U.S. Provisional Application No. 61/420,264, filed Dec. 6, 2010, titled "SYSTEM AND METHOD FOR MEASURING ISOLATED HIGH VOLTAGE AND DETECTING ISOLATION BREAKDOWN WITH MEASURES FOR SELF-DETECTION OF CIRCUIT FAULTS, U.S. Provisional Application No. 61/420,259, filed Dec. 6, 2010, titled "ELECTROCHEMICAL CELL MONITORING AND BALANCING CIRCUIT WITH SELF-DIAGNOSTIC FEATURE," and U.S. Provisional Application No. 61/420,261, filed Dec. 6, 2010, titled "ELECTROCHEMICAL CELL BALANCING CIRCUITS AND METHODS, each of which is hereby incorporated by reference in its entirety.

TECHNICAL FIELD

The circuits, systems and methods described herein relate to measuring an isolated high voltage and the detection of isolation breakdown.

BACKGROUND

Electric vehicles ("EV's") and hybrid electric vehicles ("HEV's") are becoming more viable alternatives to gas-powered vehicles, but present unique challenges not found in conventional gas-powered vehicles. Electric and hybrid vehicles typically have a battery pack that includes multiple cells in series to produce a high voltage that may be on the order of hundreds of volts. In conventional gas-powered vehicles, the vehicle starter battery has a much lower voltage, typically 12-14 volts.

In EVs and HEVs, high voltage circuitry may be needed to make high voltage measurements, such as for monitoring of the pack voltage. It is desirable to check for the occurrence of a fault between the high voltage terminal of the battery pack and chassis High voltage ("HV") measurements can be performed to verify the state of contactors and safely execute the contactor state machine, to command an appropriate charging voltage and verify the charging voltage, to verify and determine charge and discharge limits, which are based in part on pack voltage, and to validate the sum of cell voltage measurements (e.g., by comparing this sum to the measured pack voltage). IF HV measurements fail, there is the possibility that the vehicle could not properly close HV contactors to enable the drive or charge mode, or could not detect a failed contactor that is stuck open or closed. There is also the possibility that the battery pack could be provided with the incorrect charge voltage or fail to charge, or that cell voltage checks would fail, preventing the vehicle from being driven.

As used herein, high voltage measurements are considered to be measurements of the pack voltage of a battery, or of systems connected to the pack voltage. Pack voltages can range from tens of volts (e.g., 20 V, 30 V, 50 V, etc.) to a few thousand volts. High Voltage (HV) measurements are not needed for measurement of the starter battery, or measurement of individual cells making up the battery pack. If the battery pack is split up into a small number of sections, such as a positive half and a negative half separated by a mid-pack disconnect, measurement of the sections would be included as high voltage measurements.

Throughout this document, the terms battery pack and battery stack may be used interchangeably.

Accurate measurement of high voltage is imperative in any battery system that contains such voltages. To provide a safe and robust system, contactors may be used to provide and remove high voltage from the service accessible terminals. A "contactor" is an electrically controlled switch used for switching a power circuit, and similar to a relay except with higher current and/or ratings. A contactor is controlled by a circuit which has a much lower power level than the switched circuit.

The ability to measure high voltage to verify the proper operation of these contactors can be provided. Accurate high voltage measurements provide feedback to the battery management system as to the state of these contactors.

The battery system will interface with external chargers. The high voltage measurement needs to be accurately provided to these chargers to ensure that an appropriate charging voltage is provided. It is also typically the responsibility of the battery management system to verify the voltage coming from the charger.

A battery management system needs to maintain accurate information about the battery stack in order to make intelligent decisions about the system. These decisions include, but are not limited to, the use of precharging systems and deciding when to close contactors, providing current and voltage limits to systems that are connected to the battery pack such as chargers and motor controllers, and data collection. Additionally, the pack high voltage measurement is used to validate the cell voltage measurements by comparing the pack HV measurement to the sum of the cell measurements. This provides an additional validation that the cell voltage measurements are accurate.

SUMMARY

Some embodiments relate to a system for making high voltage measurements to measure a voltage of a battery pack and detect of an isolation fault. The system includes a first resistive divider having at least a first resistive element and a second resistive element and a second resistive divider having the second resistive element and a third resistive element. The system also includes a plurality of switches comprising a first switch and a second switch coupled between the second resistive element and the battery pack. The system also includes a controller configured to control the plurality of switches to operate in first mode to measure the voltage of the battery pack based on a voltage produced by the first resistive divider, and to control the plurality of switches to operate in at least a second mode to detect an isolation fault based on a voltage produced by the second resistive divider.

Some embodiments relate to a system for measuring a voltage of a battery pack and a detecting of an isolation fault. The system includes a plurality of resistive elements and a plurality of switches connected to the plurality of resistive elements. The system also includes a controller configured to control the plurality of switches to operate in first mode to measure the voltage of the battery pack based on a signal produced by coupling the plurality of resistive elements to the battery pack in a first configuration, and to control the plurality of switches to operate in at least a second mode to detect an isolation fault based on a signal produced by coupling the plurality of resistive elements to the battery pack in at least a second configuration.

Some embodiments relate to a system for measuring a magnitude of an isolation fault from a battery pack. The system includes a first resistive divider comprising at least a first resistive element and a second resistive element and a second resistive divider comprising the second resistive element and a third resistive element. The system also includes a plurality of switches coupled between the second resistive element and the battery pack. The system further includes a controller configured to control the plurality of switches to operate in a first mode to make a first measurement using the first resistive divider, to make a second measurement using the second resistive divider, and to determine a magnitude of the isolation fault based on the first and second measurements.

The foregoing summary is provided by way of illustration and is not intended to be limiting.

DETAILED DESCRIPTION

Figure 1:
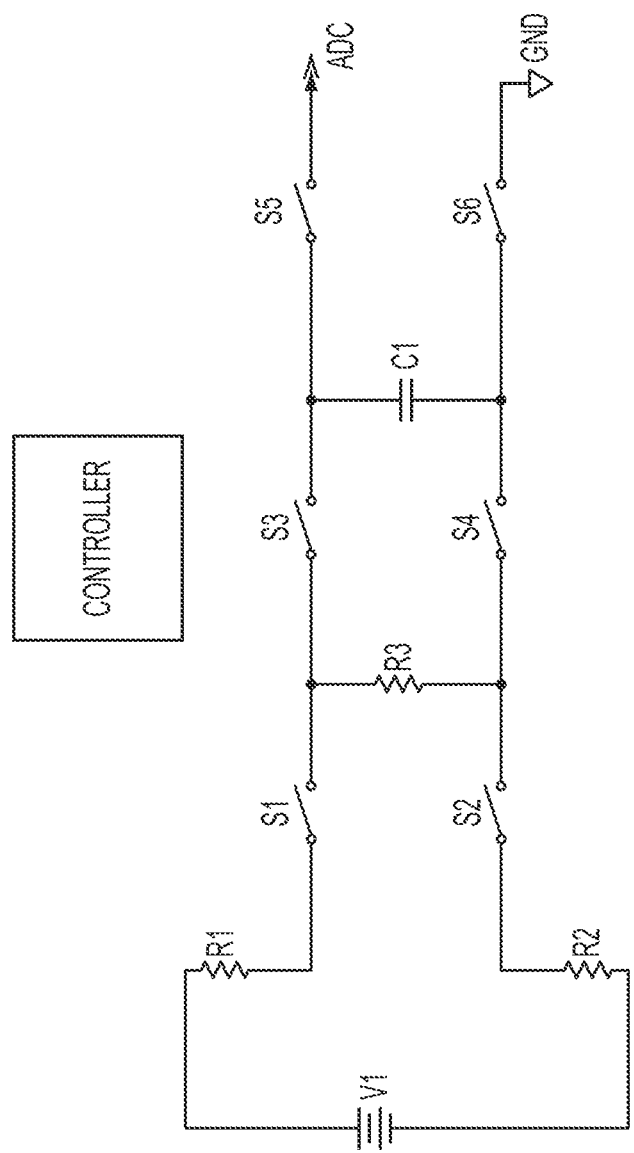
FIG. 1 shows a schematic of embodiment of a HV measurement system including switches, a voltage divider, and a capacitor to sample the voltage.

FIG. 1 shows a schematic of an embodiment of a HV measurement system. As shown in FIG. 1, the HV measurement system includes three resistors R1, R2 and R3 forming a resistor divider, switches S1-S6, a capacitor to hold the measurement and an Analog to Digital Converter (ADC) to convert the voltage into a digital value.

Figure 1A:
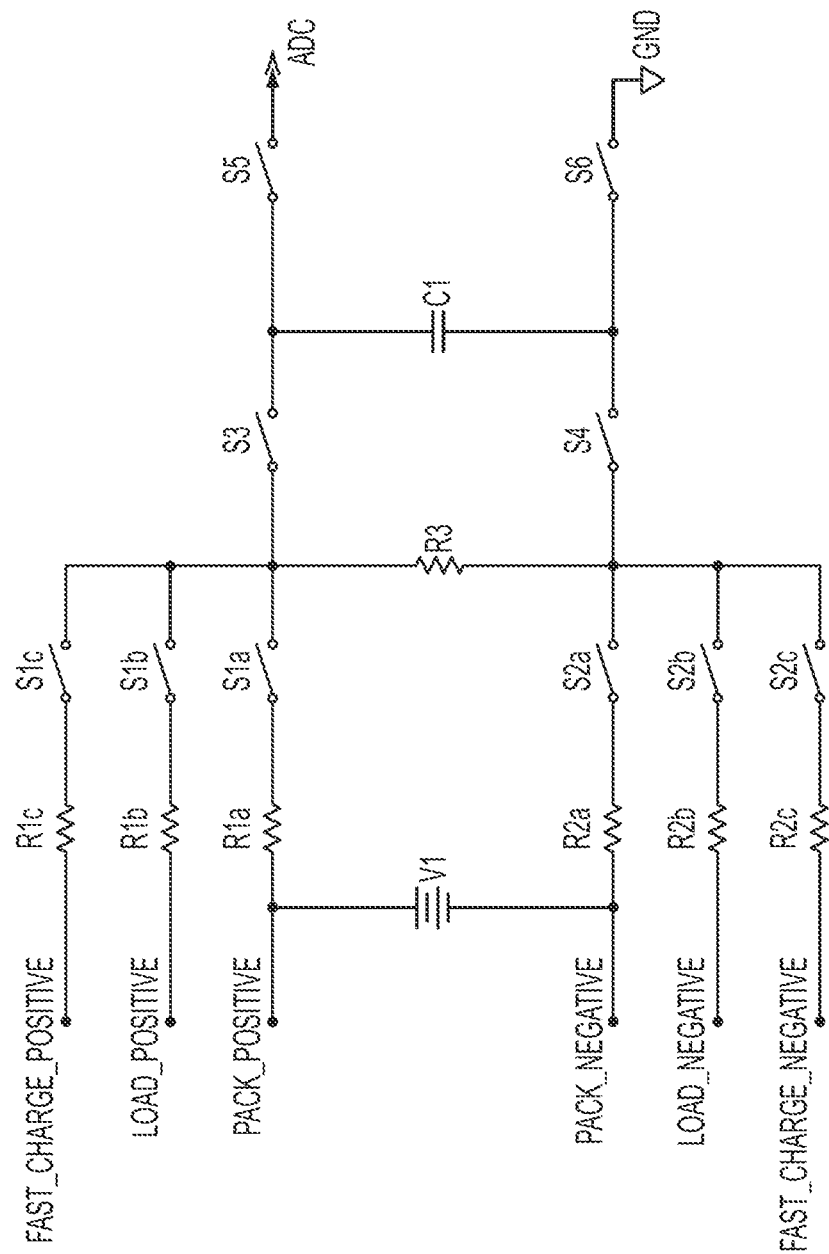
FIG. 1a shows a schematic illustrating that the HV measurement system is scalable and can be used to make measurements of additional voltages.

The system in FIG. 1 shows an HV measurement system with two sense points. The to sense points are connected to a pack voltage V1. The sense points are at the junctions between V1 and R1 and between V1 and R2. This system is scalable to any number of sense points by adding a resistor and series switch $S_n$ from the corresponding point, positive or negative, on R3 to the node to be measured, as shown in FIG. 1a. These additional points can be used to measure voltage on the load side of contactors, voltages across a mid-pack contactor or mid pack disconnect, or other high voltages as desired.

As will be described, this system is inexpensive and scalable, utilizing shared circuitry for the HV and isolation measurements to reduce component cost and size. The system is reliable and includes multiple methods of self-detection to cover most circuit and system failures. The system is safe, with protection built in to prevent a failure from leading to a hazardous event.

Isolated High Voltage Measurement

The voltage to be measured is represented in FIG. 1 as V1. Closing switches S1 and S2 sets up a resistor divider between R1, R2 and R3. Note that this can be any number of resistors that serve to scale the voltage to be measured to a level that is within the acceptable limits of the Analog to Digital Converter (ADC) measuring the voltage. When the resistor divider has settled to a steady voltage, switches S3 and S4 are closed to charge C1 in parallel with R3. When C1 has had sufficient time to charge, switches S3 and S4 are opened, removing the resistors to maintain isolation, while C1 holds the measurement. The ADC then reads the value through closed switched S5 and S6. The converted value may then be multiplied in software by the known nominal resistor divider ratio to return to the actual value for V1.

Figure 2:
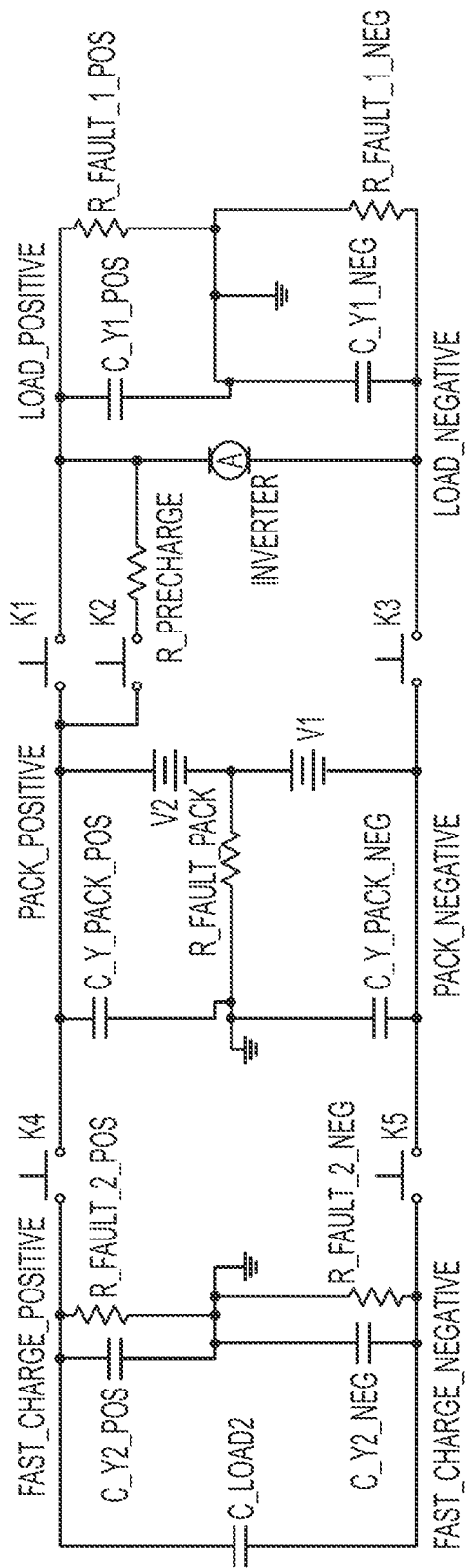
FIG. 2 is a schematic of a vehicle with Y-Capacitance and isolation faults.

FIG. 2 represents a vehicle with Y-Capacitance and isolation faults. Y-Capacitance is any capacitance between the battery pack and the chassis, and can exist from many sources. It can exist as parallel plate capacitance between the batteries and the chassis, it can exist in monitoring circuitry, and it is added to chargers and inverters in order to filter out noise as mandated by Electromagnetic Compliance (EMC) regulations. Isolation faults are any resistive connections between the batteries and chassis. A single isolation fault resistance can reference the battery pack to chassis. If this occurs, a person working on the battery pack and touching chassis could complete the circuit, resulting in a potentially dangerous or actually dangerous condition, depending on the severity of the fault. Furthermore, if there are two or more isolation faults, current will flow through them, discharging the cells and perhaps damaging the circuitry. Finally, isolation faults may be an indication of electrolyte leakage from the cells or other failures, and can be an input to a "state of health" measurement for the batteries. It is important to note that isolation faults can exist in the battery system either as a single fault or a distributed fault creating a single Thevenin equivalent fault. Isolation faults can also exist in chargers, inverters, battery monitoring circuits or anything else connected to batteries. The fault resistance and Y-Capacitance seen by the battery pack will change, and is a function of what is connected to the battery pack at any given time.

Figure 3:
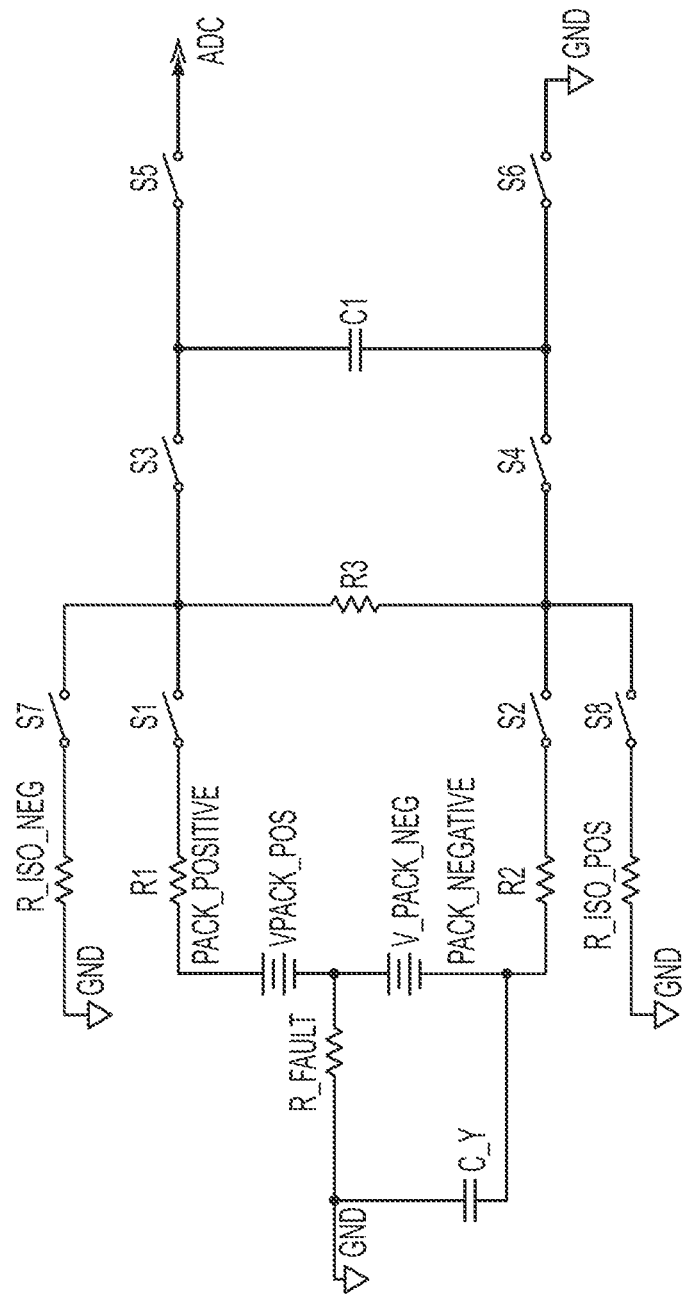
FIG. 3 shows an embodiment of a preferred HV measurement system with integrated Isolation Fault Detection.

FIG. 3 shows a schematic of an embodiment of a HV measurement system with integrated Isolation Fault Detection. FIG. 3 shows the circuitry with VPack connected to R1 and R2. It is possible that a fault may be present at any voltage in the battery stack. FIG. 3 splits the battery pack into an upper section ($V_{Pack\_Pos}$) and a lower section ($V_{Pack\_Neg}$), with the fault between the two. It is possible that $V_{Pack\_Pos}$ or $V_{Pack\_Neg}$ may be 0V, which would indicate a fault directly from pack positive or pack negative to chassis. The sum of $V_{Pack\_Pos}$ and $V_{Pack\_Neg}$ is equal to the total pack voltage. Furthermore, it is possible to have multiple faults, shown as in FIG. 2. For FIG. 3, the faults have been combined into a single Thevenin equivalent fault shown as R_Fault. V_Pack, R_Fault and C_Y are outside of the HV measurement system. Note R_Fault is the Thevenin equivalent of all resistive paths to chassis, and C_Y is the parallel combination of all connected capacitors. The integrated isolation fault detection is part of the HV system and is comprised of R_ISO_POS, R_ISO_NEG, S7 and S8. Note, R_ISO_POS and R_ISO_NEG can actually be the same resistive element, because they are never used at the same time. V_Pack_Pos is the portion of the battery pack above the isolation fault while V_Pack_Neg is the portion of the battery pack below the isolation fault. The system does not know V_Pack_Pos or V_Pack_Neg until after the measurements have been completed. Deriving the equations to determine R_Fault, V_Pack_Pos and V_Pack_Neg are simplified by drawing FIG. 3 with the pack split into two sections. The sum of V_Pack_Pos and V_Pack_Neg is V_Pack. Also, R_Fault and C_Y will change depending on what is connected to the battery pack. For example, C_Y will become much higher when the inverter is connected to the battery pack.

The isolation fault detection can utilize components already in place for HV measurement to reduce board cost and complexity. To take a measurement, a resistor divider is set up from the positive of the high voltage battery stack to the chassis by closing S1 and S8. This voltage is then measured by closing S3 and S4 to charge the capacitor C1, then opening S3 and S4 and closing S5 and S6 to measure the voltage. This measurement will be labeled V_Measure_Pos, and it is very likely not equal to V_Pack_Pos. A similar process is repeated, now setting up a resistor divider from chassis to the negative of the high voltage battery stack by closing S2 and S7 and then repeating the steps above with respect to switches S3-S6 to measure the voltage. This measurement will be labeled V_Measure_Neg, it is very likely not equal to V_Pack_Neg. A third measurement is made which is V_Pack. With three measurements: V_Measure_Pos V_Measure_Neg and V_Pack, the values of V_Pack_Pos, V_Pack_Neg and R_Fault can be determined.

The Following Section will show how to calculate R_Fault, V_Pack_Pos and V_Pack_Neg given V_Pack, V_Measure_Pos and V_Measure_Neg.

As a simplification, let the sum of R_ISO_NEG (or R_ISO_POS)+R3+R1 (or R2) be known as R_Measure. V_Measure would be the voltage measured across R_Measure and can be determined by taking the ADC reading and multiplying it by R_Measure/R3. Thus, $$V\_Measure = \frac{R\_Measure * V\_ADC}{R\_3}$$

$$R\_Measure = R\_ISO\_NEG + R3 + R2 = R\_ISO\_POS + R3 + R1$$

Knowledge of the HV pack voltage, the scaled voltage across the measurement circuitry, and the known nominal resistance in the circuit allows calculation of the R_FAULT. Measuring from both the positive and negative extremes of the pack allows calculation of V_Pack_Neg, which is the location of the fault within the battery stack. Note, the measurement technique will be first shown without the effects of C_Y and then the effects of C_Y will be shown later in the process.

Figure 4:
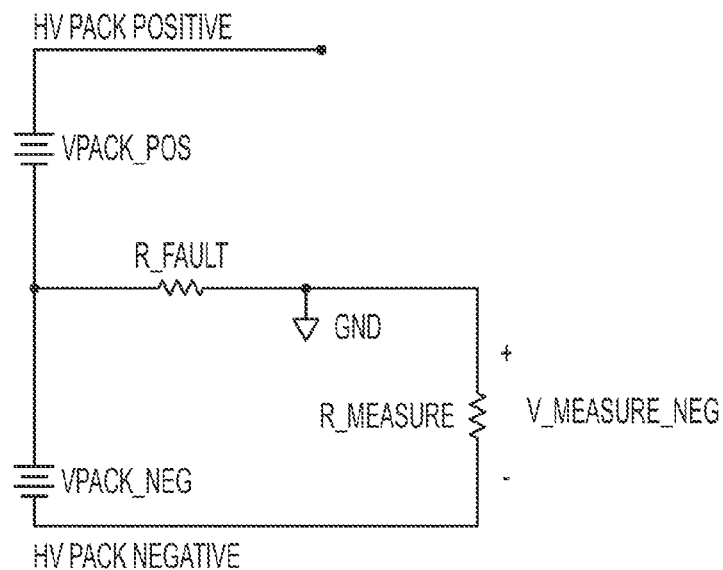
FIG. 4 is a schematic illustrating the measurement of an isolation fault from the negative half of a high voltage battery stack.

FIG. 4 is a schematic illustrating the measurement of an isolation fault from the negative half of a high voltage battery stack. It is a simplification of FIG. 3 where the measurement circuit has been replaced with a R_Measure across which we measure V_Measure and C_Y has been removed.

Closing switch S2 and S7 sets up a measurement from the negative of the high voltage battery to chassis ground. In the event that R_FAULT is present, meaning that there is a measureable fault from a positive voltage to chassis, a current loop will be completed generating a voltage across the measurement circuit. If R_Fault is not present, R_Fault can be considered infinitely large, and the measured voltage would be 0V. The current will be called I_Neg.

$$I\_Neg = \frac{V\_Pack\_Neg}{R\_Measure + R\_Fault} = \frac{V\_Measure\_Neg}{R\_Measure} \qquad (1)$$

Figure 5:
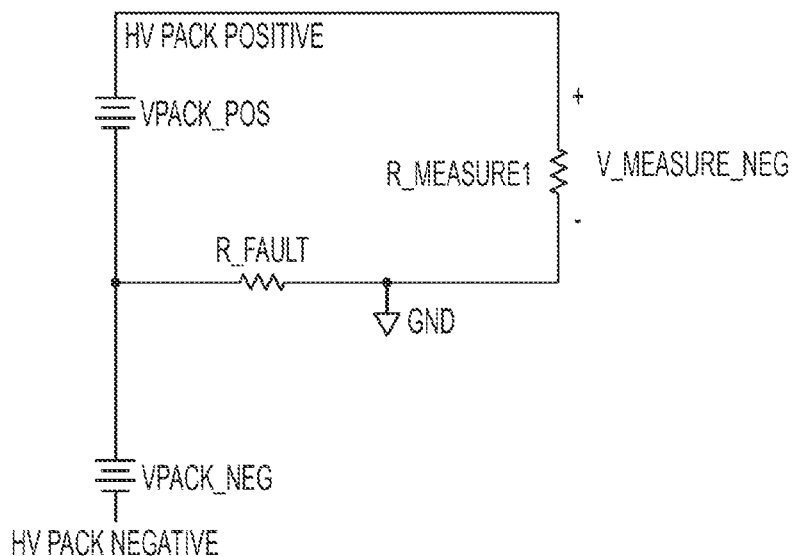
FIG. 5 is a schematic illustrating the measurement of an isolation fault from the positive half of a high voltage battery stack.

FIG. 5 is a schematic illustrating the measurement of an isolation fault from the positive half of a high voltage battery stack. FIG. 5 is a simplification of FIG. 3 where the measurement circuit has been replaced with a resistor R_Measure across which we measure V_Measure, and C_Y has been removed. Closing switch S1 and S8 sets up a measurement from the positive of the high voltage battery to chassis ground. In the event that R_FAULT is present, meaning that there is a measureable fault from the high voltage battery to chassis, a current loop will be completed generating a voltage across the circuit. This voltage is measureable using the described above for high voltage measurements. The resulting circuit generates a loop current $I_{Pos}$.

$$I\_Pos = \frac{V\_Pack\_Pos}{R\_Measure + R\_Fault} = \frac{V\_Measure\_Pos}{R\_Measure} \qquad (2)$$

With the knowledge of the loop currents $I_{neg}$ and $I_{pos}$ and the fact that the battery pack voltage is the sum of the V_Pack_Pos and V_Pack_Neg, the following equations can be derived.

$$V\_Pack = V\_Pack\_Pos + V\_Pack\_Neg \qquad (3)$$

$$I\_Neg + I\_Pos = \frac{V\_Pack\_Neg}{R\_Measure + R\_Fault} + \frac{V\_Pack\_Pos}{R\_Measure + R\_Fault} \qquad (4)$$

Substituting equations for $I_{neg}$ and $I_{pos}$:

$$\frac{V\_Measure\_Pos}{R\_Measure} + \frac{V\_Measure\_Neg}{R\_Measure} = \qquad (5)$$
$$\frac{V\_Pack\_Neg}{R\_Measure + R\_Fault} + \frac{V\_Pack\_Pos}{R\_Measure + R\_Fault}$$

Simplifying and rearranging:

$$\frac{V\_Measure\_Pos + V\_Measure\_Neg}{R\_Measure} = \frac{V\_Pack\_Neg + V\_Pack\_Pos}{R\_Measure + R\_Fault} \qquad (6)$$

Substituting (3) into (6)

$$\frac{V\_Measure\_Pos + V\_Measure\_Neg}{R\_Measure} = \frac{V\_Pack}{R\_Measure + R\_Fault} \quad (7)$$

$$R\_Fault = \frac{V\_Pack * R\_Measure}{V\_Measure\_Pos + V\_Measure\_Neg} - R\_Measure \quad (8)$$

$$R\_Fault = \left(\frac{V\_Pack}{V\_Measure\_Pos + V\_Measure\_Neg} - 1\right) * R\_Measure \quad (9)$$

R_Fault Measurement Error

There will be errors relating to resistor tolerances, switch resistance ranges, RC times to charge the measurement capacitor, internal leakage of the capacitor, and Analog to Digital Converter (ADC) accuracy. These errors affect the V_Pack term, both V_Measure terms, and the R_Measure term.

Some of these errors will skew measurements in the same direction and will be cancelled out of the R_Fault calculation. For example, if all 3 readings, V_Pack, V_Measure_Pos and V_Measure_neg are 5% too high, the ratio $$\frac{V\_Pack}{V\_Measure\_Pos + V\_Measure\_Neg}$$

will not change, and no error will be introduced.

Any errors in R_Measure will affect the R_Fault result directly. Also, some types of errors such as Integral Non Linearity (INL) within the Analog to Digital Converter (ADC) may skew different measurements in different directions. This can decrease the accuracy of the measurement of R_Fault.

A second item to consider with R_Fault is the sensitivity of the measurement to measurement errors in different ranges of R_Fault. If R_Fault is in a very low range, the term $$\left(\frac{V\_Pack}{V\_Measure\_Pos + V\_Measure\_Neg} - 1\right)$$

is approaching 0. At this point, small measurement errors will have large relative effects on measuring R_Fault. For very large values of R_Fault, the term:

$$\left(\frac{V\_Pack}{V\_Measure\_Pos + V\_Measure\_Neg} - 1\right)$$

is getting quite large. In this range, a small error in the denominator can have large effects on the accuracy of R_Fault. In general, this system is most accurate at measuring values of R_Fault that are on the same order of magnitude as R_Measure.

Expanding on the errors:

There are two values for R_Measure, the value that software thinks R_Measure is: R_Measure ideal, and a real value: R_Measure.

Similarly, a perfect system would have perfect measurements for V_Pack, V_Measure_Pos and V_Measure_Neg. However, the system will actually make readings between V_Pack_min and V_Pack_max, V_Measure_Pos_min and V_Measure_Pos_max for V_Measure, and V_Measure_Neg_min and V_Measure_Neg_max for V_Measure_Neg.

R_Measure_min (real value)<=R_Measure_ideal (value in software)<=R_Measure_max (real value)

V_Pack_Measured_Min (software value including errors<=V_Pack (real value) V_Pack (real value)<=V_Pack_Measured_Max (software value including errors)

V_Measure_Pos_Min (software value including errors) <=V_Measure_Pos (real value) V_Measure_Pos (real value) <=V_Measured_Pos_Max (software value including errors)

V_Measure_Neg_Min (software value including errors) <=V_Measure_Neg (real value) V_Measure_Neg (real value)<=V_Measured_Neg_Max (software value including errors)

$$V\_Measure = \frac{R\_Measure * V\_ADC}{R\_3}$$

$$V\_Measure = \frac{R\_Measure * V\_ADC}{R\_3}$$

$$R\_Fault\_measured\_min = \\ \left(\frac{V\_Pack\_measured\_min}{V\_Measure\_Pos\_max + V\_Measure\_Neg\_max} - 1\right) * \\ R\_Measure\_ideal \quad (10)$$

$$R\_Fault\_measured\_max = \\ \left(\frac{V\_Pack\_measured\_max}{V\_Measure\_Pos\_min + V\_Measure\_Neg\_min} - 1\right) * \\ R\_Measure\_idal \quad (11)$$

Given:

V_Pack, R_Fault, R_Measure_Ideal, V_Pack_Neg (and therefore V_Pack_Pos), and knowledge of the tolerances of R_Measure, as well as measurement errors for V_Measure_Neg, V_Measure_Pos and V_Pack, the range of possible R_Faults that could be measured can be calculated.

It is important to calculate the errors under different combinations appropriately. For example, errors in R_Measure will affect all three measurements and the final calculation. However, due to shared componentry, some errors can affect the measurements independently and stack up. Other errors affect all measurements in the same manner and cancel each other out.

Determination of the Fault Location

Once R_Fault is known, it is possible to determine the location (in terms of voltage) within the pack of the fault, using:

$$R\_Fault = \left(\frac{V\_Pack}{V\_Measure\_Pos + V\_Measure\_Neg} - 1\right) * R\_Measure \quad (9)$$

$$\frac{V\_Pack\_Neg}{R\_Measure + R\_Fault} = \frac{V\_Measure\_Neg}{R\_Measure} \quad (2)$$

$$V\_Pack\_Neg = \frac{V\_Measure\_Neg * (R\_Measure + R\_Fault)}{R\_Measure} \quad (12)$$

If there is a single fault, this will be the location of the fault, if there are multiple, this would be the Thevenin equivalent location. While this system cannot determine if there are multiple faults; if the Thevenin equivalent fault is severe enough to warrant taking a vehicle out of service, service technicians may use more advanced diagnostic techniques to locate and repair multiple faults. Determination of the magnitude of the Thevenin equivalent fault is on of the main functions for the HV measurement system.

The Effects of Y-Capacitance on Measuring R_Fault

In order to take measurements with Y-Capacitance present, the range of Y-Capacitance may be taken into account. While Y-Capacitors normally exist between pack positive and pack negative to chassis, and also from the cells to chassis, from an AC perspective, it does not matter where they are within the pack. Accordingly, the parallel combination of all of the capacitors is added up and placed as a single equivalent Y-Capacitance for analysis purposes.

Figure 6:
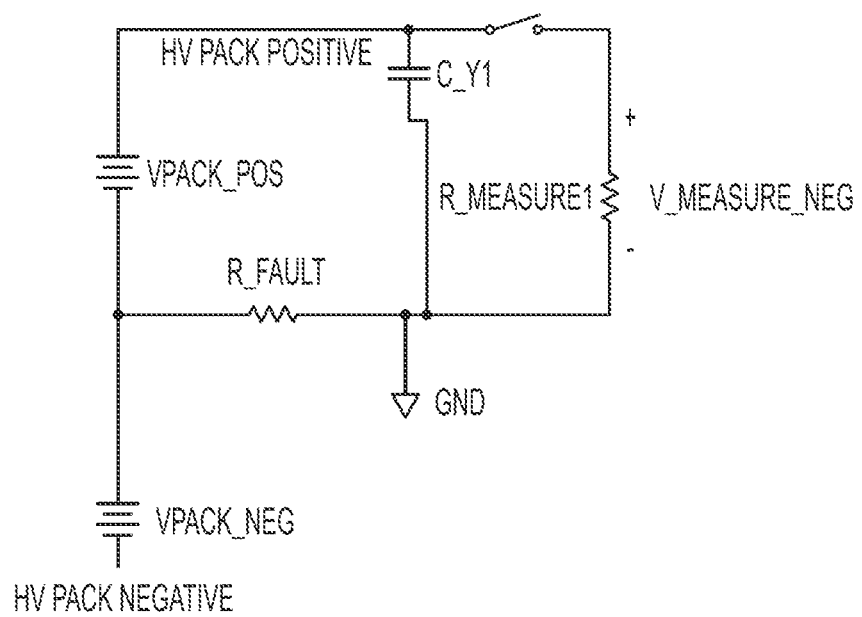
FIG. 6 is a simplification of FIG. 3 where the measurement circuit has been replaced with a resistor R_Measure across which is measured V_Measure and a switch.

FIG. 6 is a simplification of FIG. 3 where the measurement circuit has been replaced with a R_Measure across which we measure V_Measure and a switch. The switch is actually a combination of S1,S2,S7 and S8 in FIG. 3. FIG. 6 shows the Y-Capacitance between Pack_Positive and GND, but it could just as easily be represented as being between pack negative and GND or in parallel with R_Fault. FIG. 6 also shows a single switch in series with R_Measure1. This switch represents all switches in series on the measurement circuit such that R_measure can be connected to the circuit or disconnected from the circuit.

The initial conditions for this circuit with the switch open would be: The voltage on C_Y1=V_Pack_Pos as long as R_Fault is a low enough value to ensure that C_Y1 settles after any previous charging or discharging.

Figure 7:
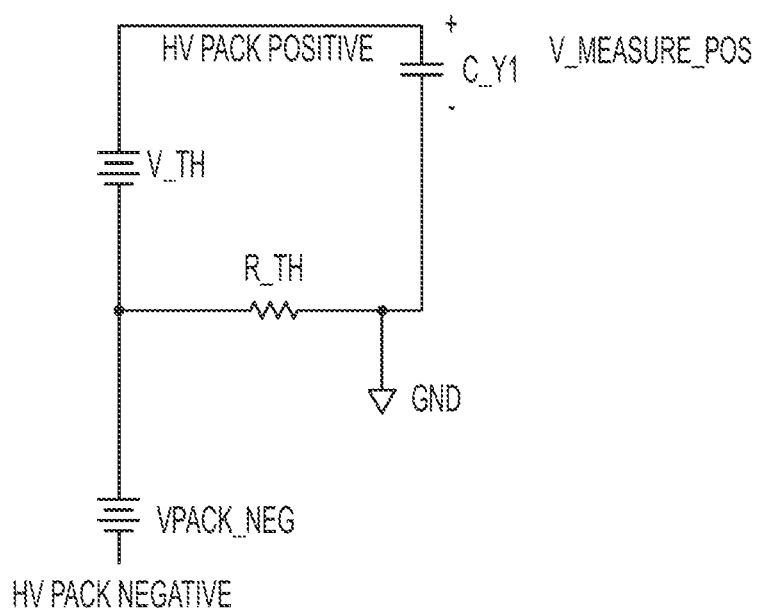
FIG. 7 is a simplification of FIG. 6 used to determine how quickly C_Y settles after the switch has been closed.

With the switch closed, a new circuit would exist which would be the equivalent of FIG. 7. FIG. 7 is a simplification of FIG. 6 used to determine how quickly C_Y settles after the switch has been closed. As in FIG. 6, if the system settles sufficiently before making an isolation measurement, C_Y will start with a voltage of V_Pack_Pos across it. If R_Fault is a large resistance, C_Y could start at any voltage (but R_Fault would be quite large). In FIG. 7, C_Y starts at a voltage labeled V_Initial. It moves to a voltage of V_Final=V_Th through a resistance of R_Th, V_Th is the Thevenin equivalent Voltage of the network of V_Pack_Pos, R_Fault and R_Measure. R_Th is the Thevenin equivalent resistance of R_Fault and R_Measure as seen by C_Y.

$$V\_Th = \frac{V\_Pack\_Pos * R\_Measure}{R\_Measure + R\_Fault} \quad (13)$$

$$R\_Th = \frac{R\_Fault * R\_Measure}{R\_Measure + R\_Fault} \quad (14)$$

(Parallel combination of R_Fault and R_Measure)

$$\tau = R\_Th * C\_y \quad (15)$$

$$V\_Measure\_Pos(t) = (V\_Initial - V\_th) * e^{-t/\tau} + V\_th \quad (16)$$

$$V\_Error(t) = V\_Measure\_Pos(t) - V\_th \quad (17)$$

$$V\_Error(t) = (V\_Initial - V\_th) * e^{-t/\tau} \quad (18)$$

The Effects of Y-Capacitance Measurement Time, and Other Errors on the Accuracy of R_Fault.

If R_Fault is small, and there is a long enough duration between isolation measurements, V_Initial=V_Pack_Pos Based on the measurement time, t, there will be a certain difference between the measured voltage, and the measured voltage if the circuit were given infinite time to settle. This error can be added to the other errors when calculating how accurately the overall isolation fault has been measured.

Also note that R_th and therefore τ are both decreased significantly when R_Fault is much less than R_Measure. Also, the smaller the value of R_Fault, the closer to V_Initial that V_th is. Therefore, any errors introduced by waiting a short time duration affect larger values of R_Fault much more than the errors affect small values of R_Fault.

This information can be combined with the original R_Fault accuracy information. For the basic measurement errors, these can be measured, and are minimal when R_Fault is on the same order of magnitude as R_Measure. Taking Y-Capacitance into account, Measurement of R_Fault is minimal when R_Fault, R_Measure and C_Y allow for faster settling and/or the measurement time is made long enough to allow C_Y to settle.

With all the information available, the following constraints can be balanced to deliver an optimized system.

Vehicle Running:
  a) With the vehicle running, R_Fault should be accurate at least at certain lower values to determine whether or not it is safe to operate the vehicle.
  b) With the vehicle running, there will be higher capacitance which will decrease R_Fault accuracy at higher values.
  c) With the vehicle running, shorter measurement times may be used so that regular pack and load voltages may be measured more frequently.

Vehicle not Operating
  d) With the vehicle not operating, R_Fault should be accurate across a larger range including higher values that could indicate early issues with leakage within the battery pack.
  e) With the vehicle not operating, there is less Y-capacitance because certain loads are disconnected.
  f) With the vehicle not operating, isolation measurement times may increase because pack measurements and other measurements do not need to be made as frequently The software that works with this circuit uses this information as follows: There are two thresholds of R_Fault values, one that is used to determine whether or not the vehicle may close or keep contactors closed, and a $2^{nd}$ threshold for warnings. Both of these thresholds are set at low values of R_Fault which would indicate whether or not the vehicle is safe to drive. These values are set up so that there is a range associated with each value, and the range of R_Fault that could be at each threshold is known ahead of time based on the range of C_Y and the allowable range of V_Pack. These ranges are made to be large enough to allow for measurement errors and RC settling time errors. The measurement time can then be optimized for speed based on having accurate enough isolation measurement for safe vehicle operation.

When the vehicle is idle, off or charging, and more time can be permitted to make isolation measurements, a longer measurement period can be used to increase the accuracy of measured R_Fault values with larger fault resistances. This allows for more accurate measurements of faults and can be used to detect any potential battery issues as part of battery state of health algorithms.

The software is also able to use the same formulas for accuracy listed above to calculate the accuracy of R_Fault. These formulas take into account the different values of C_Y under the different vehicle operating conditions based on which contactors are closed.

In practice, a spreadsheet can assembled with values of R_Fault, C_Y, measurement time when operating, measurement and measurement time with the vehicle off, R_Measure, and associated errors for V_Pack, V_Measure_Pos and V_Measure_Neg. Errors can be optimized as necessary through such means as calibration, and R_Measure and measurement times can be adjusted until the system meets all desired specifications.

In practice, values in the range of 100 Ohms/Volt to 500 Ohms/volt for R_Fault are of most interest when operating the vehicle. Values in ranges up to 2000 Ohms/Volt are of interest to the vehicle when non operational. To convert from values in Ohms/Volt to actual resistances, multiply the maximum operating voltage of the battery pack*the value in Ohms/Volt to come up with an actual resistance. Desired measurement times are in the 10 s of milliseconds or faster for isolation measurements when operating. R_Fault is also constrained such that currents should be less than a few milliamps through the measurement resistors when making measurements, and that the measurement circuitry expressed in Ohms/Volt is not a concern to the vehicle manufacturer.

Detection of Capacitance

C1 can be measured as part of the diagnostic session mentioned lower within this document. The equation:

$$V\_Measure\_Pos(t) = (V\_Initial - V\_th) * e^{-t/\tau} + V\_th$$

Can be adjusted to calculate the voltage on C1 at any given time. This is a $2^{nd}$ order RC circuit with C1 and C_Y. The voltage on C1 will lag the voltage on V_Measure_Pos. Once R_Fault is determined, C_Y can be determined as follows: For small values of R_Fault, the system can be left long enough before making a measurement so that V_Initial=V_Fault. For large values of R_Fault, the measurement circuit R_Measure can be used to bring chassis towards Pack_Negative, and then the positive measurement can be made with a known V_Initial.

Once V_Initial is known, by sampling the curve $$V\_Measure\_Pos(t) = (V\_Initial - V\_th) * e^{-t/\tau} + V\_th$$

at several points, τ can be determined, and therefore c_Y can be determined. The $2^{nd}$ order effects of C1 can be taken into account with the $2^{nd}$ order calculation being used. With two points on the curve, and knowing C1, Rth, V_th and t, C_Y can be calculated. More points can allow for exponential curve fitting and more accurate determinations of C_Y.

High Voltage to Chassis Voltage Swings.

There may be other measurements or systems that are affected by rapidly changing the voltage between chassis and high voltage points. Correctly sizing the components can minimize the effects of these swings, and understanding these swings can allow any measurement circuitry affected by them to be synchronized so that measurements are not made during the voltage swings.

Given:

$$V\_Measure\_Pos(t) = (V\_Initial - V\_th) * e^{-t/\tau} + V\_th \frac{dV}{dt} = \frac{-(V\_Initial - V\_th)}{\tau} * e^{-t/\tau} \quad (19)$$

τ is affected by C_Y and Rth. Rth is a function of the measurement resistance and the fault resistance. Finally, the voltage swing is affected by V_th and there will be a smaller voltage swing with a smaller fault resistance.

Putting this information together, components can be sized to either ensure that dV/dT never exceeds certain thresholds, or to measure how much time it takes when starting to measure an isolation fault, and how much time afterwards, a dV/dt threshold is exceeded. This information can be used to synchronize, ignore or black out certain measurements and systems during periods in which they would be inaccurate.

In some embodiments, components are sized so that all measurements may be made continuously when driving. When a vehicle is stationary, the same sized components require that cell voltage measurements be delayed until after the dV/dT has decayed to be under a predetermined threshold.

Self-Checks

On Board Detection

Figure 8:
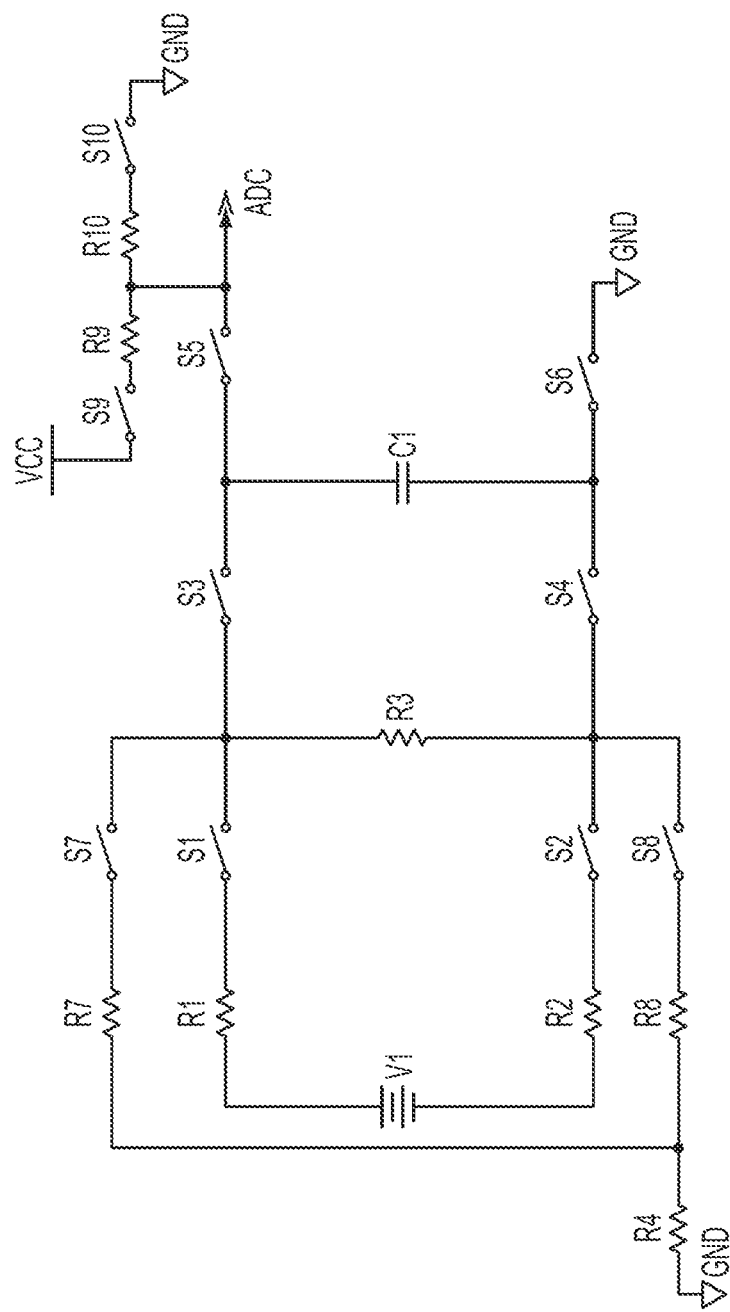
FIG. 8 shows a general circuit capable of self-diagnostics including the capability of charging and discharging the measurement capacitor without having an external voltage present.

FIG. 8 shows schematic a circuit capable of self diagnostics including the capability of charging and discharging the measurement capacitor without having an external voltage present. The embodiment of FIG. 8 is the same as that of FIG. 3 with the addition of a self-check circuit including S9 R9 S10 and R10. Furthermore, the isolation resistors R_ISO_POS and R_ISO_Neg have shared circuitry such that R4 is common to both while S7 and S8 are unique to each path. Closing a predetermined configuration of switches will charge or discharge capacitor C1 through a path of resistance. The nominal resistance of each available path is known and therefore an expected time constant is known. Measuring the voltage of the capacitor after a predetermined amount of time allows the verification of the expected switches successfully closing or opening.

Figure 9:
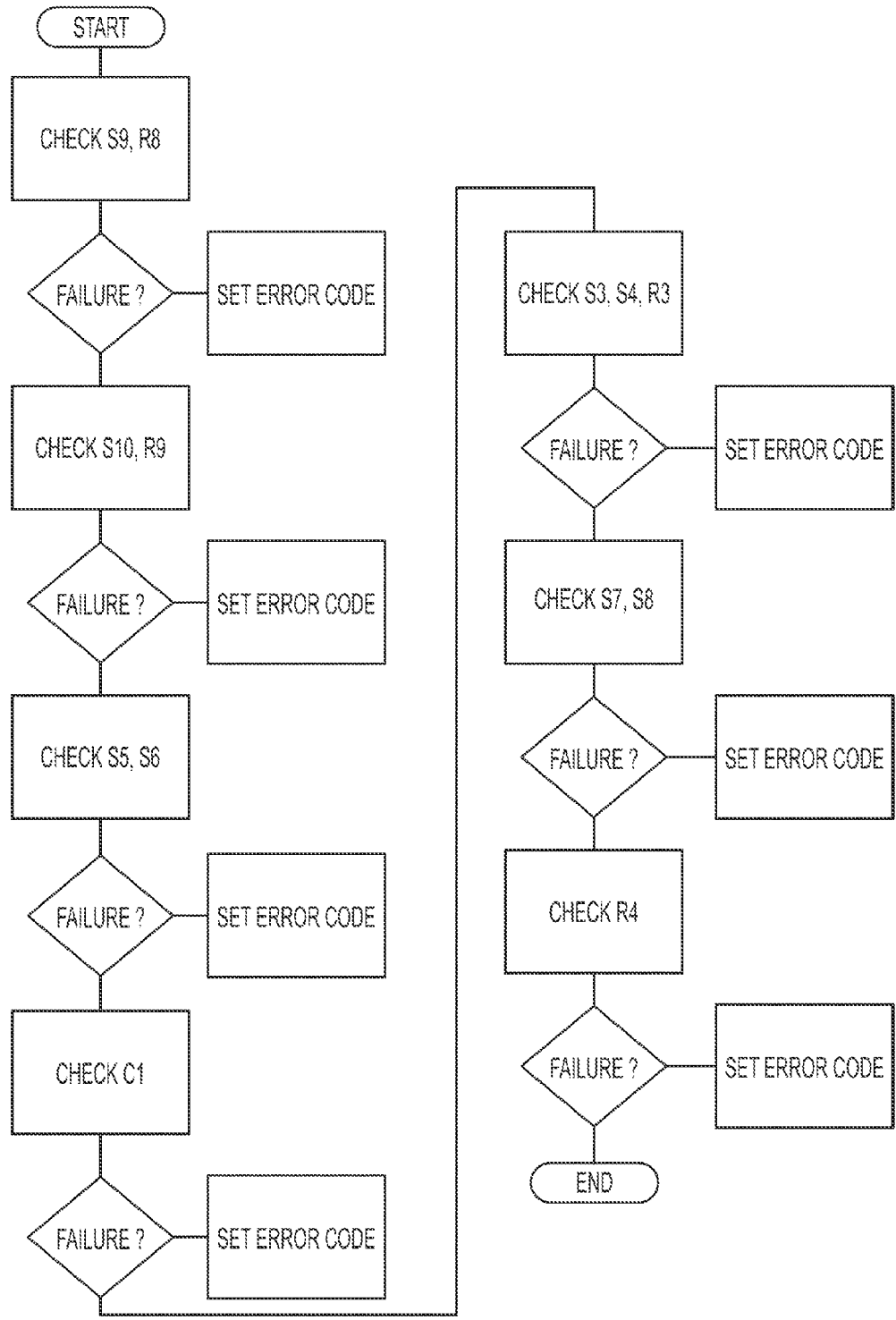
FIG. 9 shows a flowchart of steps that may be performed for validating the proper operation of the high voltage measurement circuit.

FIG. 9 illustrates the order of operations that are described below for validating the proper operation of the high voltage measurement circuit. As each segment passes the self-check, and a list of trusted components increases. If a segment fails, the sequence is ended and a failure code can be set. The specific failure may not necessarily be known. At the beginning of the test, no components are trusted, by the end of the test, every component that can be tested has been tested, and the core elements of this circuit are determined to be functional.

The timing parameters that follow demonstrate one embodiment and may easily be modified based on requirements for software timing and hardware tolerances. In particular, components may be tested in any suitable order.

Note, in general each step in the process can include 3 sub-steps:

a) Set up the switches.
b) Wait a predetermined amount of time.
c) Take a measurement.

Referencing FIGS. 6 and 7, a procedure can be performed as follows:

1. Checking the Self-Check Circuits (S9, S10, R9 and R10)
   1) Beginning with all switches open, close S9. Wait for S9 to turn on and verify that the ADC is immediately pulled up to the VCC rail
   2) Close S10 and wait for S10 to turn on completing the R9 and R10 1:2 voltage divider and measure the voltage at the ADC and ensure it is close to 50% of the VCC rail.
   3) Open S9 leaving S10 closed and wait for S9 to turn off. Once S9 opens the ADC value should be at GND.

Summary Table:

| Step | Switches Closed | ADC Value | Timing | RC | Ratio | Failures Eliminated |
|---|---|---|---|---|---|---|
| 1 | S9 | VCC | S9 on time | N/A | N/A | S10 is not closed |
| 2 | S9, S10 | 0.5 * VCC | S10 on time | N/A | 1:2 | S9 and S10 are not open, the ratio of R9 to R10 together with voltage drops in S9 and S10 is in the expected range. |
| 3 | S10 | GND | S9 off time | N/A | N/A | S9 is not closed |

2. Detect if S5 or S6 is stuck open or closed.
1) Beginning with all switches open, close switches S5, S6, S9. Wait a sufficient time for the capacitor to be close to fully charged.
2) Open S9 wait for S9 to open and then make a reading of the capacitor voltage both ensuring it is fully charged and saving it for later comparisons.
3) Close S10, wait sufficiently for the capacitor to partially discharge and then make a measurement. This measurement should be close to a certain fraction of the previous fully charged measurement based on resistor tolerances, capacitor tolerances and timing tolerances. This measurement ensures the size of R10*C1 is within expected ranges.
4) Close S9 wait sufficiently for the capacitor to approach VCC/2. Then make a measurement confirming the range.
5) Next Open S6, S9 and S10. Removing the capacitor from the circuit and wait for S6 to open. (S9 and S10 should open before S6)
6) Close S9 and as soon as S9 is closed make a measurement. If S6 opened properly, the circuit will immediately rise from VCC/2 to VCC, if S6 did not open, the capacitor will remain in the circuit and the voltage will remain near VCC/2.
7) Open S9 and S5, and Close S6
8) Close S9 and as soon as S9 is closed make a measurement. If 55 opened properly, the circuit will immediately rise from VCC/2 to VCC, if S5 did not open, the capacitor will remain in the circuit and the voltage will remain near VCC/2.
9) Close S5, wait for it to close (or longer as necessary) and make a measurement. This should be close to the measurement from step 4.
10) Close S9 and as soon as it is closed make a measurement. If S5 and S6 are closed properly, the voltage will remain near 2.5V, if either is open, the voltage will immediately rise to 5.0V Summary Table 3. Detect if S3 or S4 is stuck open or closed—Check if R3 fails open or short
1) Beginning with all switches open, close switches S5, S6, and S9. Wait enough time so that C1 should be fully charged. Measure C1 to confirm and remember this reading.
2) Open S9 and close S3. Wait a sufficient duration that C1 would have noticeably discharged if S4 was stuck closed. Make a reading, make sure it is the same as the reading from C1 taking into account acceptable-self discharge and measurement errors.
3) Open S3 and wait for it to open
4) Close S4 and wait for it to close wait a sufficient duration that C1 would have noticeably discharged if S3 was stuck closed. Make a reading, make sure it is the same as the reading from C1 taking into account acceptable self discharge and measurement errors.
5) Close S3 and Wait a sufficient duration that C1 will partially discharge through R3 Make a measurement. Ensure that the value is in the expected range based on tolerance of the capacitance, resistors and switch resistances.

| Step | Switches Closed | ADC Value | Timing | RC | Ratio | Failures Eliminated |
|---|---|---|---|---|---|---|
| 1 | S9, S5, S6 | VCC | Several τ | R9 * C1 | | NA |
| 2 | S5, S6, S3 | Same as before | S3 on time + A few τ | R3 * C1 | | S4 not stuck, C1 self discharge in range. |
| 3 | S5, S6 | | S3 off time, | | | |
| 4 | S5, S6, S4 | Same as before | S4 on time + A few τ | R3 * C1 | | S3 not stuck, C1 self discharge in range. |
| 5 | S5, S6, S3, S4 | Fraction of previous value | S4 on time + A few τ | R3 * C1 | | S3 and S4 can close, C1 * (R3 + 2 * R_SW) in range. |

| Step | Switches Closed | ADC Value | Timing | RC | Failures Eliminated |
|---|---|---|---|---|---|
| 1 | S9, S5, S6 | | Several τ + S5, S6 on time | R9‖R10 * C1 | |
| 2 | S5, S6 | VCC | | | C1 is not short circuited. |
| 3 | S10, S5, S6 | Fraction of previous value | A few τ + S10 on time | R10‖C1 | S5, S6 are not stuck open, C1 * R10 is not out of range. |
| 4 | S9, S10, S5, S6 | VCC/2 | Several τ | R9‖R10 * C1 | |
| 5 | S5 | | | | |
| 6 | S5, S9 | VCC | S9 on time | | S6 is not stuck closed |
| 7 | S6 | | | | |
| 8 | S6, S9 | VCC | S9 on time | | S5 is not stuck closed |
| 9 | S5, S6 | Previous value + tiny extra margin | | | C1 and parallel components do not self discharge out of spec |
| 10 | S5, S6, S9 | Previous value + tiny extra margin | S9 on time | | S5 and S6 are not stuck open. |

4. Measuring C1 and R_SW

If C1 is known to be within a small range, this can help measure Y_Capacitance. Knowing the values for R_SW can also help determine the exact gain of the circuit under different operating conditions.

C1 can be measured based on the tight tolerance of R3 and measuring the resistances of S3 and S4. This is done in 3 steps:
1) Turn on S9 and S10 creating a resistor divider. Based on the resister divider, the tolerances of R8 and R9 and the saturation voltage or resistance of S9 and S10, FIG. out the range for VCC.
2) Turn on S9, S5, 56, S3 and S4 and wait several time constants such that C1 is fully charged and any effects of RC times are negligible in the measured voltage. Based on this voltage and known resistances of S9 and S10, calculate the resistance of S5, S6, S3 and S4.
3) Based on the knowledge of S3 and S4, Charge up C1 and discharge it through R3, S3 and S4. Sampling the voltage repeatedly will allow for a more accurate determination of the time constant and therefore a more accurate determination of C1. Note, 2 samples can yield an answer for C1, however, if the first sample is before activating S3 and S4, the actual discharge time is unknown due to the unknown on time for S3 and S4, it is recommended to take two values after S3 and S4 have been closed to ensure an accurate time is used in determination of C1.

Using a low resistance FET as S9 and S10 will allow for more accurate determinations of the resistances of S3 through S6

If C1 is known accurately, expected measurement ranges for all other self checks, can be made much tighter and components would have to deviate less outside of their specification for failures to be detected.

| Step | Switches Closed | ADC Value | Timing | RC | Failures Eliminated |
|---|---|---|---|---|---|
| 1 | S9, S10 | VCC/2 | | | This is to FIG. out what VCC is if a different source is used to charge C1 than is used as a measurement reference. |
| 2 | S9, S3, S4, S5, S6 | [VCC − V(S9)] * (R3 + 4 * R_SW)/ (R3 + 4 * R_SW + R9) | 8 + τ | R9∥(R3 + 4 * R_SW) * C1 | This allows R_SW to be measured. |
| 3 | S3, S4, S5, S6 | Multiple samples | | (R3 + 2 * R_SW) * C1 | Based on knowledge of R3 (a precision part), and R_SW, C1 can be determined. |

5. Detect if S7 or S8 is stuck open or closed

The S3/S4 test described above must be performed and pass successful prior to testing S7 and S8.
1) Close S5, S6 and S9 wait a sufficient period of time and ensure that C1 charges up to VCC.
2) Open S9 and close S3,S4 and S8 waiting enough time so that the capacitor would discharge to a low level if S7 were also closed, but it partially discharges through R3 if S7 is open. Make a measurement ensuring it is in the expected range of discharging only through the R3 path.
3) Opening all switches, repeat 1 to charge up the capacitor again.
4) Open s9 and close S3,S4 and S7 waiting enough time so that the capacitor would discharge to a low level if S8 were also closed, but it partially discharges through R3 if S8 is open. Make a measurement ensuring it is in the expected range of discharging only through the R3 path.
5) Opening all switches, repeat 1 to charge up the capacitor again.
6) Open s9 and close S3,S4, S7 and S8 waiting enough time so that the capacitor discharges to a low level through the parallel combination of R5+R6 in parallel with R3. Make a measurement ensuring it is in the expected range of discharging only through the combined path.

An alternate embodiment is to utilize the R4 path to discharge C1 rather than R3. Resistor R4 is much larger than R3 and therefore the timing calls for much longer delays to verify the proper discharge paths.

Summary Table:

| Step | Switches Closed | ADC Value | Timing | RC | Ratio | Failures Eliminated |
|---|---|---|---|---|---|---|
| 1 | S9, S5, S6 | VCC | Several τ | R9 * C1 | | NA |
| 2 | S3, S4, S5, S6, S8 | Fraction of previous value based on (R3 + 2 * R_SW) * C1 | Switch on time + A few τ | R3 * C1 | | S7 not stuck closed |
| 3 | S9, S5, S6 | VCC | Several τ | R9 * C1 | | NA |
| 4 | S3, S4, S5, S6, S7 | Fraction of previous value based on (R3 + 2 * R_SW) * C1 | Switch on time + A few τ | R3 * C1 | | S8 not stuck closed |

-continued

| Step | Switches Closed | ADC Value | Timing | RC | Ratio | Failures Eliminated |
|---|---|---|---|---|---|---|
| 5 | S9, S5, S6 | VCC | | | | |
| 2 | S3, S4, S5, S6, S7, S8 | Fraction of previous value based | S4 on time + A few τ | R3 * C1 | | S7 and S8 not stuck open. |

-continued

| Step | Switches Closed | ADC Value | Timing | RC | Ratio | Failures Eliminated |
|------|-----------------|-----------|--------|-----|-------|---------------------|
|      |                 | on (((R7 + R8 + 2 * R_SW)||R3) + 2 * R_SW) * C1 |  |  |  |  |

Note,
comparing steps 2 and 4 to step 6, the time and resistor values together with all value and time uncertainties must be chosen so that there is no overlap on the range of expected values having R3 in the circuit versus having R3 in parallel with R5 + R6 in the circuit.

6. Detect if R4 fails open or short
   1) With all switches open close S9, S5 and S6 to charge C1 to VCC
   2) Open S9 and close S3 and S7.
   3) Wait sufficiently long that a if R4 were 50% too small, or 50% too large it would be detected.
   4) Measure the voltage on C1 ensuring a proper range for R4

| Step | Switches Closed | ADC Value | Timing | RC | Ratio | Failures Eliminated |
|------|-----------------|-----------|--------|-----|-------|---------------------|
| 1 | S9, S5, S6 | VCC | Several τ | R9 * C1 |  | NA |
| 2, 3 | S3, S5, S6, S7 | Fraction of previous value | Several τ | (R7 + R4 + 3 * R_SW) * C1 |  | R4 too large or too small |

As an alternative to measuring the discharge times as described above, it is also possible to leave S9 closed during all tests to measure the equivalent voltage divider as each switch is closed into the circuit. By knowing the expected resistor ratio, the measured voltage at the ADC can also be known. If this voltage is in the expected range it can be verified that the proper switches have opened or closed. However, depending on the relative values of components, this may or may not be desirable.

Off Board Detection

There are some failures such as failures of S1 and S2 that cannot be performed with the HV measurement system by itself. They need external voltages to be present in order to determine if everything is working properly. Self tests involving external components can ensure that the combination of external components and internal components is working properly. However if there is a failure, it could be the external component or a component within the HV system that has failed. With off board detection, the self diagnostics cannot necessarily tell whether the failure is in the HV measurement system or a component outside of the HV measurement system, only that there is a failure.

Once a unit is commissioned into service, any single point failure in the HV system and vehicle connected components is detectable. Single point failures would be a wire failure, loose connection, contactor stuck open or closed or a failure on the PCB within the HV system of a series resistor or HV switch (R1n, R2n, S1n or S2n in FIG. 1a). There may be some potential multiple point failures that the HV measurement system cannot detect. Accordingly, it is important to properly commission battery packs to ensure that there are no initial failures.

7. Ensuring S1 and S2 are not stuck closed.

For switches S1 and S2 that are permanently connected to a pack voltage, the system can ensure both proper ranges for R1 and R2 and that S1 and S2 can open and close.

This method works as follows:
1) Measure the pack voltage.
2) Ensure the pack voltage adds up to the sum of the cell voltages within tolerances
3) Go through the same steps to make a pack measurement voltage but don't close S2.
4) If S2 is stuck closed, a pack voltage would be read; if S2 is working properly 0V would be read.
5) Repeat steps 3 and 4 but with S1 left open instead of S2.

If step 1 or step 2 fails, it could be a switch or resistor within the HV measurement system that has failed stuck open. It could also be that the pack voltage is not present, or a mid pack disconnect or contactor is open.

Further Off Board Detection

Figure 10:
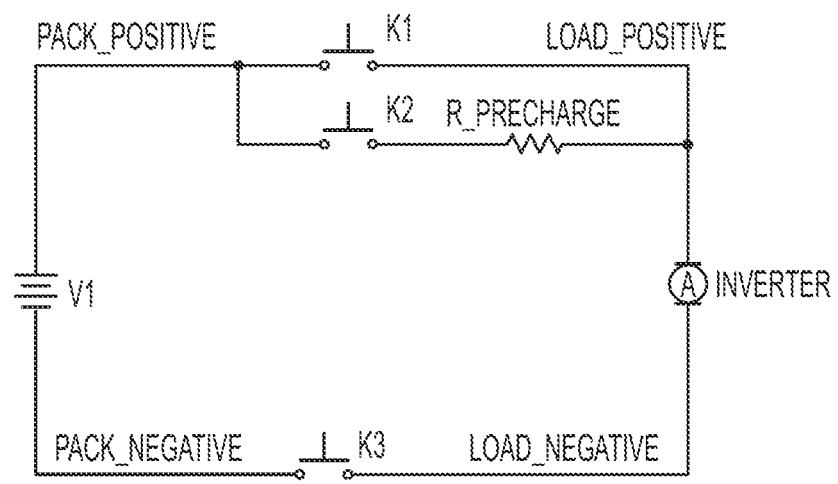
FIG. 10 shows a simplified vehicle circuit, which includes the high voltage battery pack (V1), a contactor circuit with pre-charge (K1, K2 and K3), and the vehicle inverter.

One example of an application of this HV measurement system is for high energy storage systems such as those used in electric and hybrid electric vehicles, although it may be used in other applications, such as grid-tied energy storage systems, for example. FIG. 10 shows a simplified vehicle circuit, which includes the high voltage battery pack (V1) a contactor circuit with pre-charge (K1, K2 and K3) and the vehicle inverter. High voltage sense points would be placed at PACK_POSITIVE and PACK_NEGATIVE, as well as LOAD_POSITIVE and LOAD_NEGATIVE. Measuring the difference between the positive and negative points provides information on the state of the contactors and the pre-charge timing.

Once a valid pack voltage is established, that is a pack voltage is measured that is in the expected range for the application, it can be determined if a failure occurs in the rest of the HV measurement system that is not covered in On Board Detection. When a voltage is measured, any switch involved in the measurement can be opened and it can be verified that the measurement is no longer valid. This is to ensure that the switch in question has successfully opened. If the next time the same measurement is attempted there is no voltage present, it can be determined that there is an open component somewhere in the measurement path indicating a failure that wasn't previously present. This could be a wire or connection failure, an open contactor, open resistor or open HV switch. The root cause of the problem is not important as any one of these failures requires the vehicle to be brought in for service.

The HV measurement system works hand in hand with the contactor software. The contactor software will continuously scan HV voltage measurements to determine if there is a voltage present when no voltage is expected. This would be a sign that a contactor has welded closed.

Any HV switch (S1n or S2n) stuck is detectable when making another measurement that does not use the switch in question. If there are two positive side switches closed and one negative side switch closed, the effective resistor ratio will be changed. For example, consider FIG. 1a with S1C stuck closed, and Fast charge positive connected to pack positive. A measurement is being made between pack positive and pack negative so S1a and S2a are also closed. R1c and R1a are in parallel changing the effective gain of the circuit. The same is true for two negative side switches and one positive side switch closed. The change is resistor ratio will change the HV measurement from one measurement to the next For this consider R1c stuck closed, but Fast charge positive is currently connected to Pack Negative. Note that failures of S1C stuck closed (fast charge positive are possible when measuring the pack voltage and when the fast charge positive sense point is connected to either pack positive or pack negative due to a combination of contactors being closed.

Figure 11:
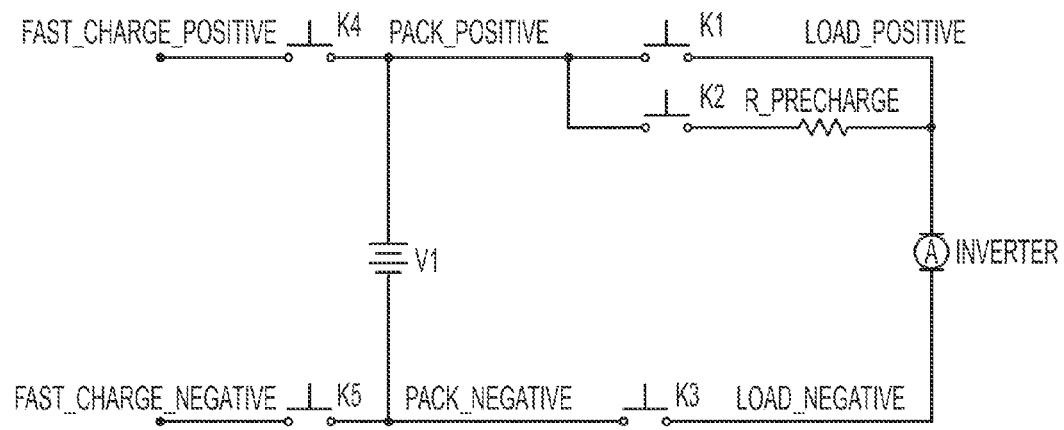
FIG. 11 shows another vehicle circuit with FAST_CHARGE_POSITIVE and FAST_CHARGE_NEGATIVE included as additional HV sense points.

By adding more sense points, a more complicated high voltage system may be adapted. This could include an extra set of positive and negative contactors for direct access to the HV bus for high current DC charging, auxiliary loads or any other application that requires access to the HV bus. An example application is shown in FIG. 11. The FAST_CHARGE_POSITIVE and FAST_CHARGE_NEGATIVE nets are additional HV sense points. By measuring FAST_CHARGE_POSITIVE with respect to PACK_NEGATIVE a fault of K4 stuck closed is detectable. By measuring PACK_POSITIVE with respect to FAST_CHARGE_NEGATIVE a fault of K5 stuck closed is detectable.

in series. Capacitors C2 and C3 in combination with R1 and R2 provide a low pass filter effect, while keeping the capacitance to a minimum by sharing it with any number of R1's or R2's. Too much capacitance will increase the undesirable effect of the chassis point swinging with respect to the high voltage reference as measurements are in progress. The chassis moving could cause errors in cell measurements.

Additional Aspects

In conclusion, the embodiments described here are extremely robust in providing means for measuring high voltage and isolation breakdowns from an isolated battery stack. The system is expandable to any number of or configuration

| Failure Mode | Detection Method |
|---|---|
| K1 or K2 stuck closed | With K1 and K2 open, measure the voltage from LOAD_POSITIVE with respect to PACK_NEGATIVE. If the result is not zero then a contactor is stuck closed. |
| K3 stuck closed | With K3 open, measure voltage from PACK_POSITIVE with respect to LOAD_NEGATIVE. If the result is not zero then the contactor is stuck closed. |
| K4 stuck closed | With K4 open, measure FAST_CHARGE_POSITIVE with respect to PACK_NEGATIVE. If the result is not zero then the contactor is stuck closed. |
| K5 stuck closed | With K5 open, measure PACK_POSITIVE with respect to FAST_CHARGE_NEGATIVE. If the result is not zero then the contactor is stuck closed. |
| R_PRECHARGE stuck open or short | Will be detected in contactor state machine as a precharge too fast or too slow. |
| R1n or S1n open | Appears same as an open contactor or no pack voltage |
| R1n or R2n short or value too low. | Every R1 and R2 on the schematic is actually made up of multiple resistors in series in order to allow for a higher voltage solution, and to ensure safety even when a single component is damaged. If one of the two resistors that makes up R1n is broken, approximately ¼ of the overall resistance will be removed from the circuit. This would result in measurements in the system that are 4/3 of the proper value, which must be detected. For the R1n and R2n for pack voltage, this is part of the self check. For other resistors, this must be detected before it results in unsafe operation. For regular precharge, if the measured value is ⅓ too high, the system could think a contactor set has fully precharged when it has only precharged to ⅔ of the final value. If contactors are fully closed at this point, the final contactor or load capacitor can be damaged. This can be detected and prevented by ensuring that more than one precharge measurement is in range before closing a final contactor. If the system is reading ⅔ of the final value, the voltage will continue to precharge quickly towards full value, and by the time two adequately timed measurements are made, the $2^{nd}$ reading would be above pack voltage and a DTC would be set. If the voltage is being read properly, the voltage would not change too much between the two readings, and precharge would be considered complete after the $2^{nd}$ reading. |
| S1n stuck closed | Once a valid measurement is recorded, open the switch and make sure that the measurement is now zero. Additionally, when making a different measurement there will be two R1n resistors in parallel, which changes the ratio so that the measurement appears 4/3 as big. Or one R1n will go to pack+ or pack− also changing the ratio so that the voltage will read too low. Switches for pack voltage are detected as part of the self checks. Switches relating to a load will affect the pack voltage making it read too high or too low and comparisons between the pack voltage and the average cell voltage will set a DTC occurs. |
| R2n or S2n open | Appears same as an open contactor or no pack voltage |
| R2n short | See R1n short |
| S2n stuck closed | See S1n stuck closed. |

Distributed Resistance

Figure 12:
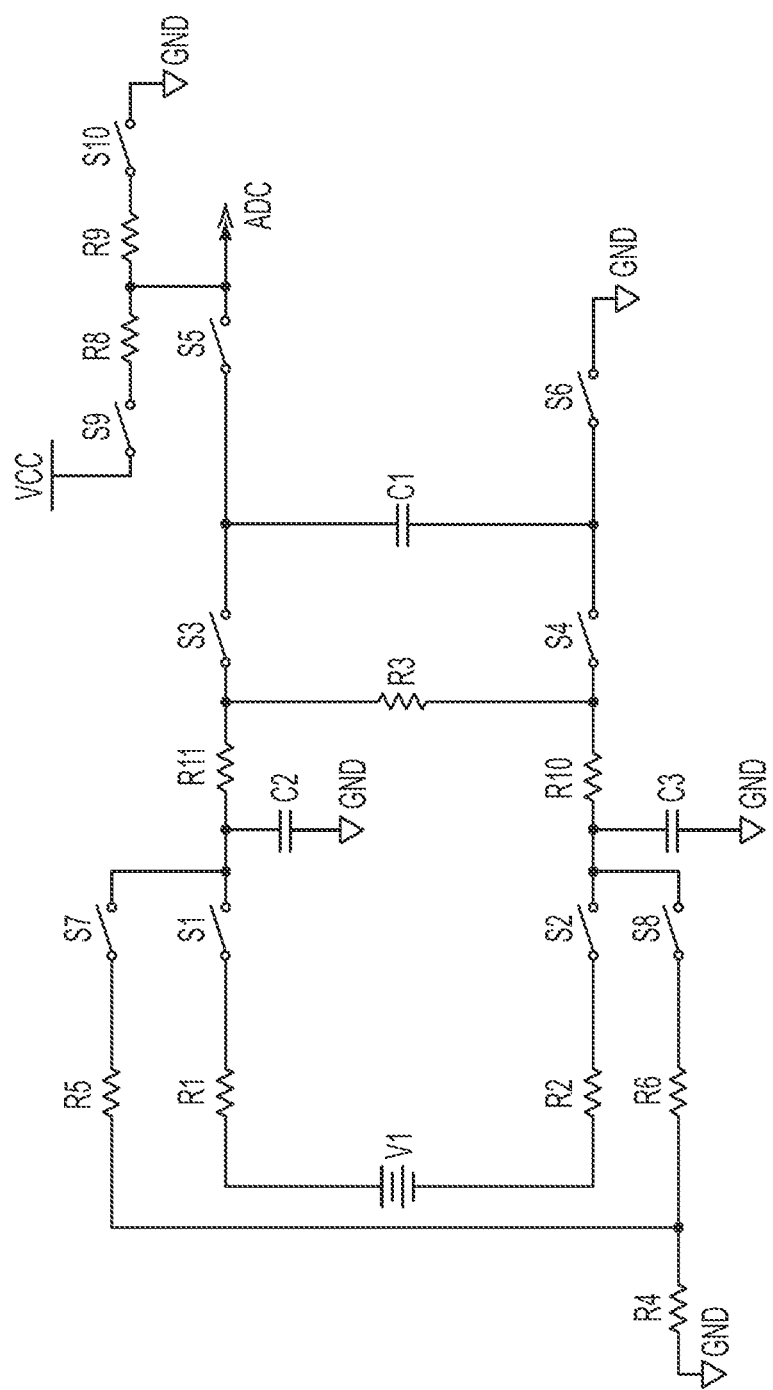
FIG. 12 shows an embodiment similar to that of FIG. 8 in which additional series resistors are included.

The series resistance that sets up the voltage dividers R1, R2 and R3 below can be made up of multiple resistors in series and can be expanded to include R11 and R10 as shown in FIG. 12. In doing so voltage ratings of the resistors can be minimized and the component count is also minimized as R10 and R11 will be shared for any number of R1's or R2's. It is also possible to expand any resistor into multiple resistors of sense points to allow any configuration of contactor circuits to be utilized. The methods above provide self-detection for not only component level failures but system level failures such as wiring faults.

Of particular interest are large-scale systems used for storing electrical energy for the propulsion of vehicles as well as energy storage systems for electrical grid support and supplying power to remote locations. These systems are generally considered to have expectations of long service life and extremely low failure rates. For example, the proposed ISO 26262 standard and the ASIL standards for vehicles have very stringent requirements for safety and reliability, and in the future very stringent requirements be government-mandated.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

For example, embodiments of controllers, such as controllers for controlling the switches of the circuits described herein and/or the making of measurements (e.g., based on a software algorithm), may be implemented using hardware, software or a combination thereof. When implemented in software, the software code can be executed on any suitable hardware processor or collection of hardware processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed to perform the functions recited above.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Note that the actual embodiment may be realized using discrete electronics, integrated circuits or the construction of the most or all of the entire system on a single application-specific integrated circuit (ASIC) specifically for this application.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A system for making high voltage measurements to measure a voltage of a battery pack and detect of an isolation fault, the system comprising:
    a first resistive divider comprising at least a first resistive element and a second resistive element;
    a second resistive divider comprising the second resistive element and a third resistive element;
    a plurality of switches comprising a first switch and a second switch coupled between the second resistive element and the battery pack; and
    a controller configured to control the plurality of switches to operate in first mode to measure the voltage of the battery pack based on a voltage produced by the first resistive divider, and to control the plurality of switches to operate in at least a second mode to detect an isolation fault based on a voltage produced by the second resistive divider.

2. The system of claim 1, wherein the controller is configured to control the plurality of switches to operate in a third mode to verify operation of the plurality of switches.

3. The system of claim 1, wherein the first and third resistive elements are connected to first and second terminals of the battery pack, respectively.

4. The system of claim 1, wherein the first switch is connected between the first resistive element and the second resistive element and the second switch is connected between the second resistive element and the third resistive element.

5. The system of claim 1, wherein the system is configured to measure the voltage of the battery pack by measuring a voltage across the second resistive element that is representative of the voltage of the battery pack.

6. The system of claim 5, further comprising:
    a second plurality of switches coupled to the second resistive element, wherein the controller is configured to sample the voltage across the second resistive element by turning on the second plurality of switches.

7. The system of claim 6, further comprising a capacitor connected to the second plurality of switches to sample the voltage across the second resistive element.

8. The system of claim 1, further comprising a third switch to connect the third resistive element to the second resistive element when the plurality of switches are controlled to operate in the second mode, wherein the controller is configured to make a first isolation fault measurement when the plurality of switches are controlled to operate in the second mode and the third switch is turned on.

9. The system of claim 8, further comprising:
    a fourth switch to connect the third resistive element or a fourth resistive element to the second resistive element when the plurality of switches are controlled to operate in the second mode, wherein the controller is configured to make a second isolation fault measurement when the plurality of switches are controlled to operate in the second mode and the fourth switch is turned on.

10. The system of claim 7, further comprising a third plurality of switches in series with the second plurality of switches to couple the capacitor to a measurement circuit.

11. The system of claim 10, wherein the controller is configured to control the system in a self-check mode to verify operation of the third plurality of switches, the second plurality of switches and/or the first plurality of switches.

12. The system of claim 1, further comprising:
    an analog to digital converter configured to receive a voltage produced by the first or second resistive divider and convert the voltage produced by the first or second resistive divider to a digital value.

13. The system of claim 12, further comprising:
a self-check circuit connected to an input of the analog-to-digital converter to couple the analog-to-digital converter to at least one reference voltage.

14. The system of claim 13, wherein the controller is configured to verify operation of the self-check circuit by coupling the input of the analog-to-digital converter to the at least one reference voltage to verify that the digital value produced by the analog-to-digital converter is indicative of the at least one reference voltage.

15. The system of claim 1, wherein the controller is configured to determine a voltage across the isolation fault.

16. The system of claim 1, wherein the controller is configured to determine the magnitude of the isolation fault.

17. The system of claim 16, wherein the controller is configured to determine a degree of uncertainty with which the magnitude of the isolation fault is measured.

18. The system of claim 17, wherein the controller is configured to make isolation measurements in a first mode with a first measurement timing and a second mode with a second measurement timing.

19. The system of claim 18, wherein the first measurement timing and the second measurement timing are selected based on a desired measurement accuracy for the first mode, and the second mode, respectively.

20. The system of claim 1, wherein the controller is configured to measure a capacitance in parallel with the isolation fault.

21. The system of claim 1, wherein the controller is configured to temporarily disable cell measurements while isolation measurements are made.

22. The system of claim 1, further additional resistors and switches to make additional high voltage measurements.

23. A system for measuring a voltage of a battery pack and a detecting of an isolation fault, the system comprising:
a plurality of resistive elements;
a plurality of switches connected to the plurality of resistive elements; and
a controller configured to control the plurality of switches to operate in first mode to measure the voltage of the battery pack based on a signal produced by coupling the plurality of resistive elements to the battery pack in a first configuration, and to control the plurality of switches to operate in at least a second mode to detect an isolation fault based on a signal produced by coupling the plurality of resistive elements to the battery pack in at least a second configuration.

24. The system of claim 23, wherein the controller is configured to control the plurality of switches to operate in the second mode to couple the plurality of resistive elements to the battery pack in the second configuration to make a first isolation fault measurement, and to control the plurality of switches to operate in a third mode to couple the plurality of switches to the battery pack in a third configuration to make a second isolation fault measurement.

25. The system of claim 24, wherein the controller is configured to detect an isolation fault based on the first and second isolation fault measurements.

26. The system of claim 24, wherein the controller is configured to determine a magnitude of the isolation fault based on the first and second isolation fault measurements.

27. A system for measuring a magnitude of an isolation fault from a battery pack, the system comprising:
a first resistive divider comprising at least a first resistive element and a second resistive element;
a second resistive divider comprising the second resistive element and a third resistive element;
a plurality of switches coupled between the second resistive element and the battery pack; and
a controller configured to control the plurality of switches to operate in a first mode to make a first measurement using the first resistive divider, to make a second measurement using the second resistive divider, and to determine a magnitude of the isolation fault based on the first and second measurements.

28. The system of claim 27, wherein the controller is configured to determine a voltage across the isolation fault.

29. The system of claim 27, wherein the controller is configured to determine a degree of uncertainty with which the magnitude of the isolation fault is measured.

30. The system of claim 27, wherein the controller is configured to measure a capacitance in parallel with the isolation fault.

* * * * *